(12) United States Patent
Lo et al.

(10) Patent No.: US 9,330,956 B1
(45) Date of Patent: May 3, 2016

(54) METHOD FOR MANUFACTURING SEMICONDUCTOR DEVICE

(71) Applicant: UNITED MICROELECTRONICS CORPORATION, Hsinchu (TW)

(72) Inventors: Jen-Chieh Lo, Hsinchu (TW); Chao-Ming Cheng, Taipei (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/605,933

(22) Filed: Jan. 26, 2015

(51) Int. Cl.
| | |
|---|---|
| *H01L 21/76* | (2006.01) |
| *H01L 21/762* | (2006.01) |
| *H01L 21/3105* | (2006.01) |
| *H01L 21/027* | (2006.01) |
| *H01L 21/311* | (2006.01) |
| *H01L 21/763* | (2006.01) |
| *H01L 29/66* | (2006.01) |
| *H01L 27/115* | (2006.01) |
| *H01L 27/105* | (2006.01) |

(52) U.S. Cl.
CPC ...... *H01L 21/76224* (2013.01); *H01L 21/0274* (2013.01); *H01L 21/31055* (2013.01); *H01L 21/31111* (2013.01); *H01L 21/31116* (2013.01); *H01L 21/31144* (2013.01); *H01L 21/31053* (2013.01); *H01L 21/763* (2013.01); *H01L 27/1052* (2013.01); *H01L 27/11526* (2013.01); *H01L 29/665* (2013.01)

(58) Field of Classification Search
CPC ............... H01L 21/76229; H01L 21/76232; H01L 21/31053; H01L 21/76224; H01L 21/763; H01L 27/105; H01L 27/1052; H01L 27/11536; H01L 27/11526; H01L 27/1203; H01L 21/84; H01L 27/0992; H01L 29/665; H01L 21/31055; H01L 21/0274; H01L 21/31144; H01L 21/31116
USPC .......... 438/427, 421, 424, 400, 401; 257/374, 257/446, 501, 506, E21.548, E27.001
See application file for complete search history.

(56) References Cited

U.S. PATENT DOCUMENTS

| | | | |
|---|---|---|---|
| 7,858,490 B2 | 12/2010 | Mitsuhira | |
| 8,105,894 B2 * | 1/2012 | Tajiri | H01L 21/76224 257/E21.546 |
| 2003/0030121 A1 * | 2/2003 | Heo | H01L 21/76229 257/499 |
| 2010/0252870 A1 | 10/2010 | Lin | |

* cited by examiner

*Primary Examiner* — Thinh T Nguyen
(74) *Attorney, Agent, or Firm* — Ding Yu Tan

(57) ABSTRACT

A method for manufacturing a semiconductor device is provided and comprises steps as follows. A Si substrate is provided. The Si substrate includes a first region and a second region. A sacrificial oxide layer is formed on the substrate with respect to the first region. A sacrificial nitride layer is conformally formed on the sacrificial oxide layer and on the substrate with respect to the second region. A photoresist layer is coated over the sacrificial nitride layer. A shallow trench isolation (STI) mask is provided. The STI mask has at least one first STI pattern and at least one second STI pattern to be transferred to the Si substrate to form at least one first trench and at least one second trench in the substrate. A STI oxide layer is deposited. A chemical-mechanical polishing (CMP) process is performed until the sacrificial oxide layer is removed.

18 Claims, 9 Drawing Sheets

US 9,330,956 B1

METHOD FOR MANUFACTURING SEMICONDUCTOR DEVICE

FIELD OF THE INVENTION

The present invention generally relates to a method for manufacturing a semiconductor device and, more particularly, to a method for manufacturing a semiconductor device with dual-depth shallow trench isolation (STI) structure using only one trench defining mask.

BACKGROUND OF THE INVENTION

The integrated circuit (IC) manufacturing technology have been moving forward as the metal-oxide-semiconductor field-effect transistors (MOSFET's) become smaller and smaller to improve the performances such as increased switching speed, lowered power consumption and higher level of integration. In view of device isolation, shallow trench isolation (STI) technology has advantages over the conventional local oxidation of silicon (LOCOS) technology. For example, STI technology shrinks the surface area needed to isolate transistors while offering superior latch-up immunity, smaller channel-width encroachment and better planarity.

The STI structure is an integrated circuit (IC) feature that prevents current leakage between adjacent semiconductor components. Dual-depth STI structures have attracted attention for the applications in multi-functional IC devices. For example, on a typical panel driver IC device, deeper STI structures with better isolation are required for double-diffused drain (DDD) MOS elements and shallower STI structures with less dislocation are required for complementary metal-oxide-semiconductor (CMOS) elements US Publication no. 20100252870 discloses a dual-depth STI structure having two different depths applicable to CMOS image sensor technologies, where the dual-depth STI structure refers to one STI structure in the pixel region and another STI structure in the periphery or logic region. The depth of each STI structure depends on the need and/or isolation tolerance of devices in each region.

However, the conventional dual-depth STI structure is manufactured by a two-step etching process, in which at least one trench defining mask is required for the deeper STI structure and another trench defining mask is required for the shallower STI structure.

In the present invention, a one-step etching process with etching selectivity between a sacrificial $SiO_2$ layer and the Si substrate is employed to manufacture a semiconductor device with a dual-depth STI structure using only one trench defining mask for both the deeper STI structure and the shallower STI structure at the same time.

SUMMARY OF THE INVENTION

It is one object of the present invention to provide a method for manufacturing a semiconductor device with a dual-depth STI structure using only one trench defining mask to save the time and the cost.

In order to achieve the foregoing object, in one embodiment, the present invention provides a method for manufacturing a semiconductor device. The method includes the following steps. A Si substrate is provided. The Si substrate includes a first region and a second region. A sacrificial oxide layer is formed on the substrate with respect to the first region. A sacrificial nitride layer is conformally formed on the sacrificial oxide layer and on the substrate with respect to the second region. A photoresist layer is coated over the sacrificial nitride layer. A shallow trench isolation (STI) mask is provided. The STI mask has at least one first STI pattern and at least one second STI pattern. The at least one first STI pattern and the at least one second STI pattern are transferred to the Si substrate to form at least one first trench in the substrate with respect to the first region and at least one second trench in the substrate with respect to the second region. A STI oxide layer is deposited to fill the at least one first trench and the at least one second trench. A chemical-mechanical polishing (CMP) process is performed until the sacrificial oxide layer is removed.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of the embodiments of this invention are presented herein for purpose of illustration and description only. It is not intended to be exhaustive or to be limited to the precise form disclosed.

Figure 1A:
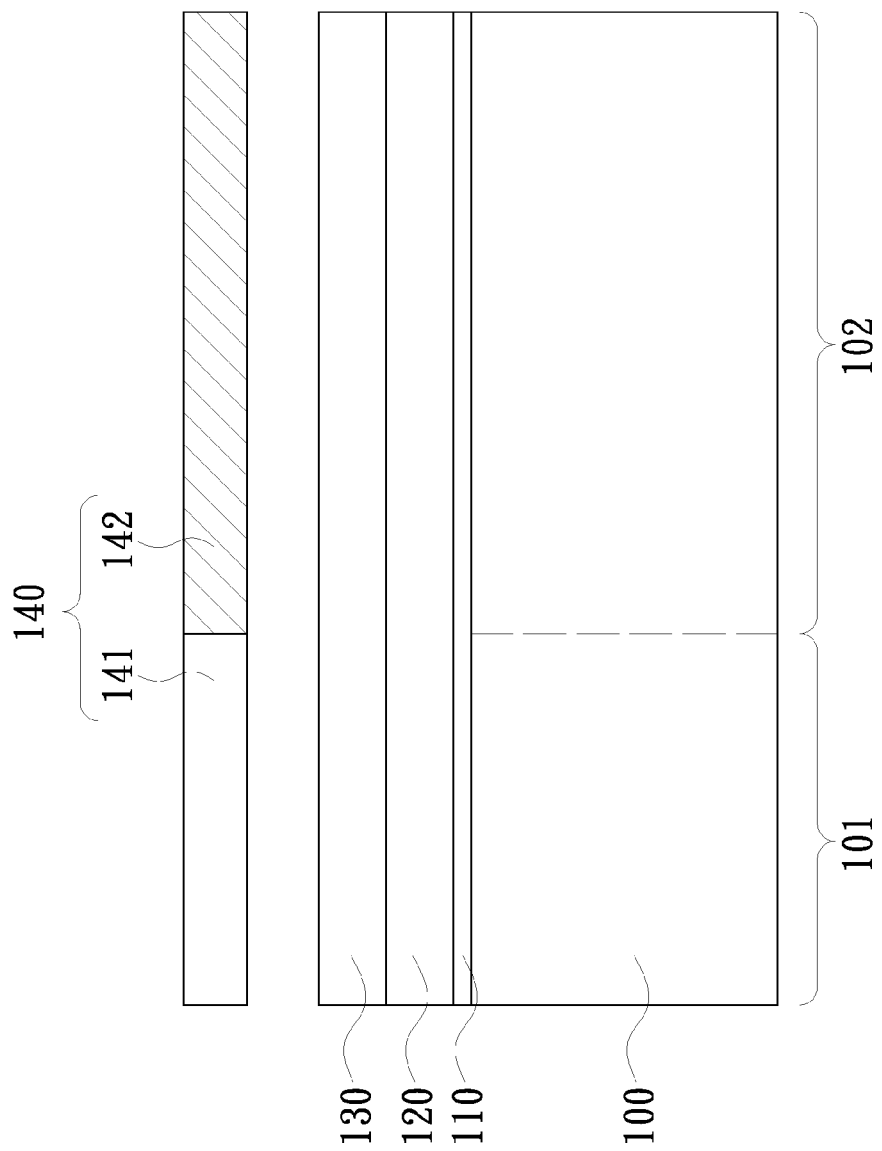
FIG. 1A to FIG. 1F are cross-sectional views showing the steps for manufacturing a semiconductor device with a dual-depth STI structure according to one embodiment of the present invention.

Please refer to FIG. 1A to FIG. 1F for cross-sectional views showing the steps for manufacturing a semiconductor device with a dual-depth STI structure according to one embodiment of the present invention. In FIG. 1A, a Si substrate 100 is provided. The Si substrate 100 includes a first region 101 and a second region 102. A pad oxide layer 110 and a thin nitride layer 120 are formed in sequence on the substrate 100. The thin nitride layer 120 is then coated by a positive photoresist layer 130.

A patterned mask 140 is provided over the positive photoresist layer 130. The patterned mask 140 has a transparent region 141 with respect to the first region 101 and a dark region 142 with respect to the second region 102. In the present embodiment, the patterned mask 140 is one of tool layer masks, which is not intentionally designed for this process. In other words, the patterned mask 140 may also be used in defining regions such as deep n-wells (DNWs), n-wells (NWs), p-wells (PWs), etc. Accordingly, no extra cost is required for this patterned mask 140.

Figure 1B:
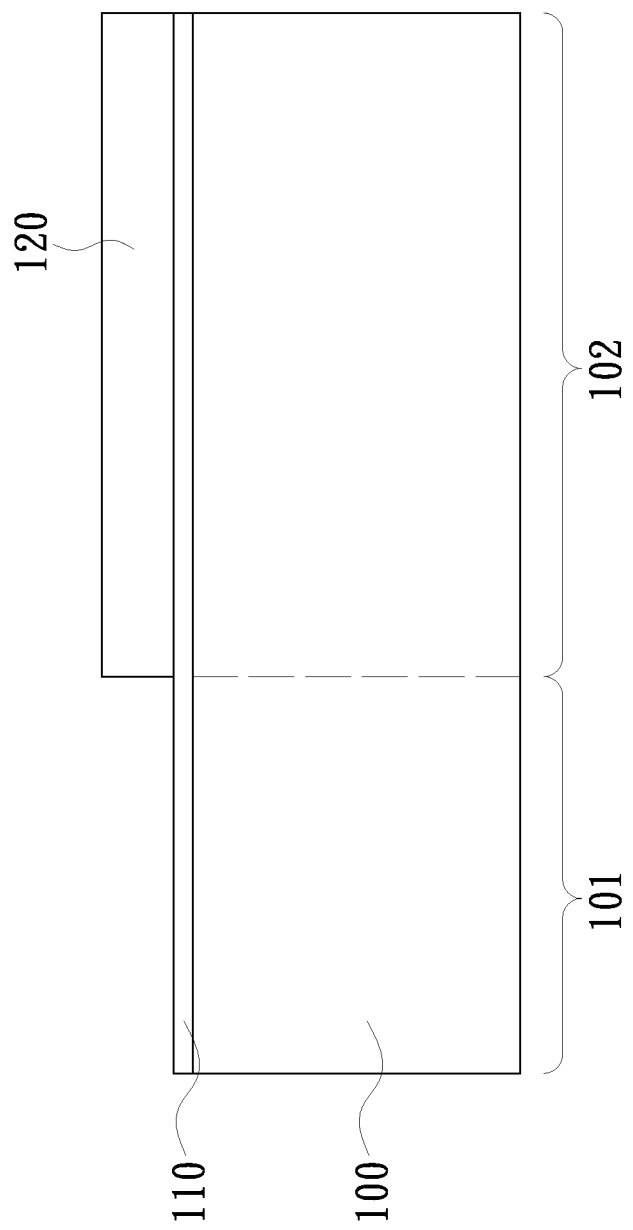

A pattern transfer process is performed from the patterned mask 140 to the thin nitride layer 120 by lithography and etching processes so that a portion of the thin nitride layer 120 with respect to the first region 101 is removed and a portion of the thin nitride layer 120 with respect to the second region 102 remains on the pad oxide layer 110 on the substrate 100, as shown in FIG. 1B.

Figure 1C:
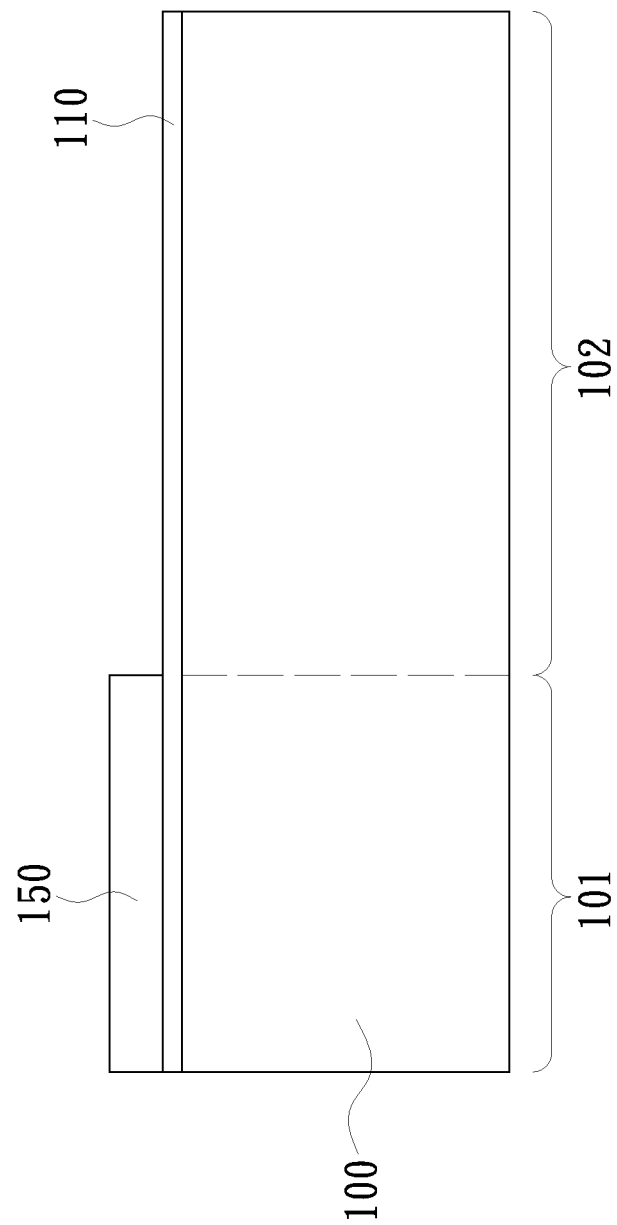

Then, in FIG. 1C, a sacrificial oxide layer 150 is formed on the pad oxide layer 110 on the substrate 100 with respect to the first region 101 and the portion of the thin nitride layer 120 on the pad oxide layer 110 on the substrate 100 with respect to the second region 102 is removed. It is noted that there is a step height difference between the top surface of the sacrificial oxide layer 150 and the top surface of the pad oxide layer 110.

Figure 1D:
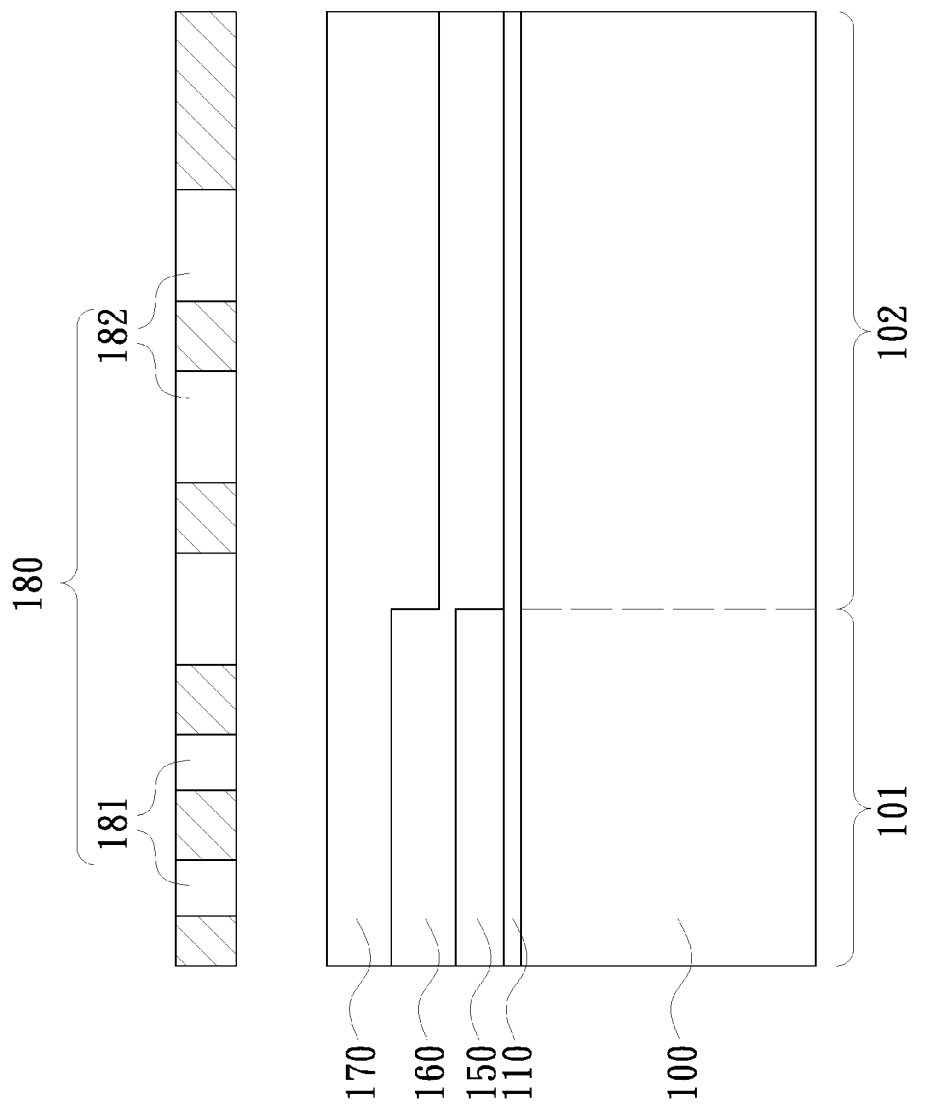

With reference to FIG. 1D, a sacrificial nitride layer 160 is conformally formed on the sacrificial oxide layer 150 and on the pad oxide layer 110 on the substrate 100 with respect to the second region 102. The sacrificial nitride layer 160 is then coated by a photoresist layer 170.

A shallow trench isolation (STI) mask 180 is provided. The STI mask 180 has at least one first STI pattern 181 and at least one second STI pattern 182. The at least one first STI pattern 181 and the at least one second STI pattern 182 are transferred to the Si substrate 100 by lithography and selective etching processes to form at least one first trench 191 in the substrate 100 with respect to the first region 101 and at least one second trench 192 in the substrate 100 with respect to the second region 102, as shown in FIG. 1E.

In the present embodiment, the photoresist layer 170 over the sacrificial nitride layer 160 is patterned by photolithography to expose a portion of the sacrificial nitride layer 160. The sacrificial nitride layer 160 is patterned by etching the exposed portion of the sacrificial nitride layer 160 using the patterned photoresist layer 170 as an etching mask to expose a portion of the sacrificial oxide layer 150 on the substrate 100 with respect to the first region 101 and a portion of the pad oxide layer 110 on the substrate 100 with respect to the second region 102.

Figure 1E:
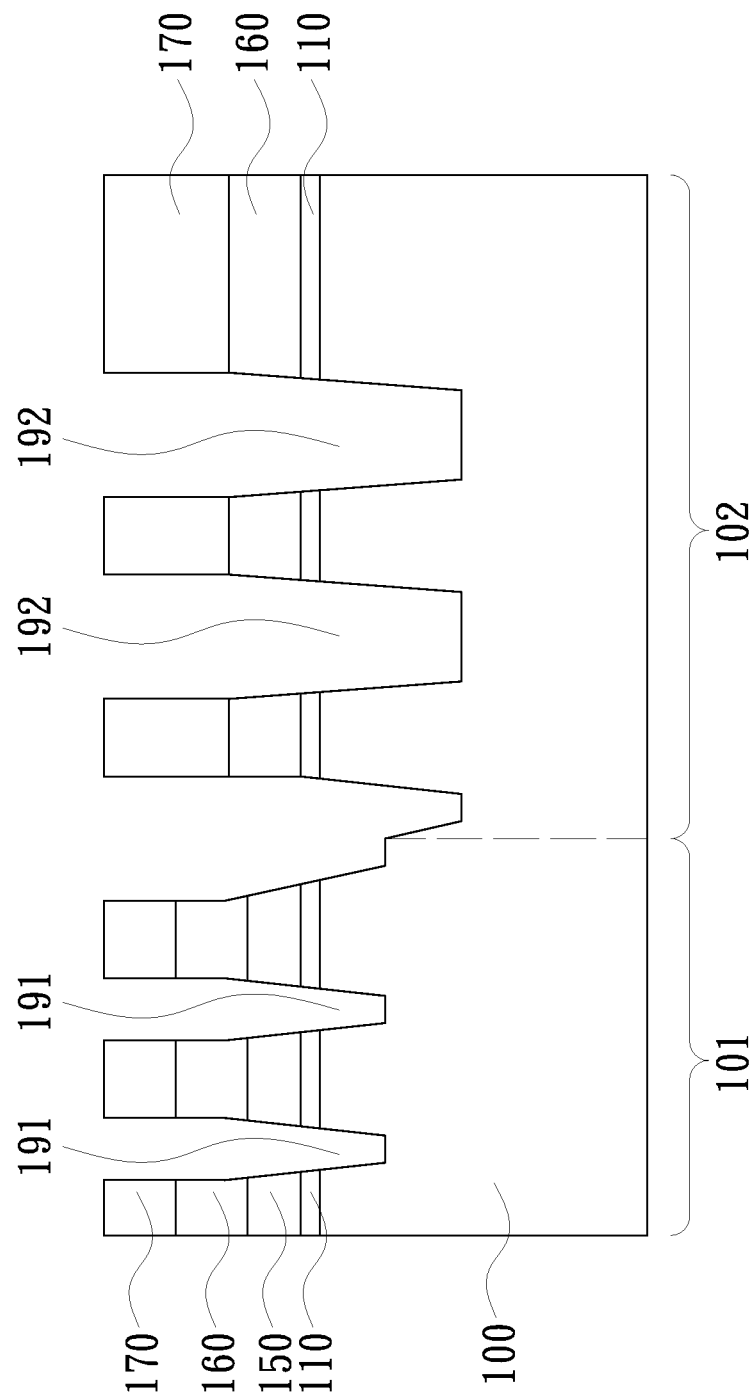

The exposed portion of the sacrificial oxide layer 150 and the exposed portion of the pad oxide layer 110 are selectively etched using the patterned sacrificial nitride layer 160 as an etching mask to form at least one first trench 191 in the substrate 100 with respect to the first region 101 and at least one second trench 192 in the substrate 100 with respect to the second region 102, as shown in FIG. 1E.

In the present embodiment, with reference to FIG. 1C and FIG. 1E, a relation for selectively etching may be expressed as:

Depth $A$=Depth $B-X$*(THK)

wherein Depth A denotes the depth of the at least one first trench 191 in the substrate 100, Depth B denotes the depth of the at least one second trench 192 in the substrate 100, THK denotes the thickness of the sacrificial oxide layer 150 and X denotes the etching selectivity ratio.

In the present embodiment, selective etching may be performed by dry etching. The dry etching process may use a mixture including $Cl_2$, $HeO_2$ and HBr within a range from $Cl_2$:$HeO_2$:HBr=1:0.3:7 to $Cl_2$:$HeO_2$:HBr=1:0.6:13 in weight, which results in an etching selectivity ratio within a range from $SiO_2$:Si=1:4 to $SiO_2$:Si=1:10. Preferably, the mixture is $Cl_2$:$HeO_2$:HBr=1:0.45:10 in weight, which results in an etching selectivity ratio of $SiO_2$:Si=1:7.

Furthermore, selective etching may also be performed by both wet etching and dry etching. The wet etching process may use tetramethylammonium hydroxide (TMAH), an alkali hydroxide base etchant. A mixture including TMAH and $H_2O$ within a range from TMAH:$H_2O$=1:20 to TMAH:$H_2O$=2:5 in weight, which results in an etching selectivity ratio within a range from $SiO_2$:Si=1:40000 to $SiO_2$:Si=1:25000. Such wet etching recipe has been used in some particular large scale devices and extremely deep trench processes.

It should be noted that the above mentioned recipe is only exemplary and not intentional to limit the present invention.

Those with ordinary skills in the art can make modifications on the previous disclosure within the scope of the present invention.

Figure 1F:
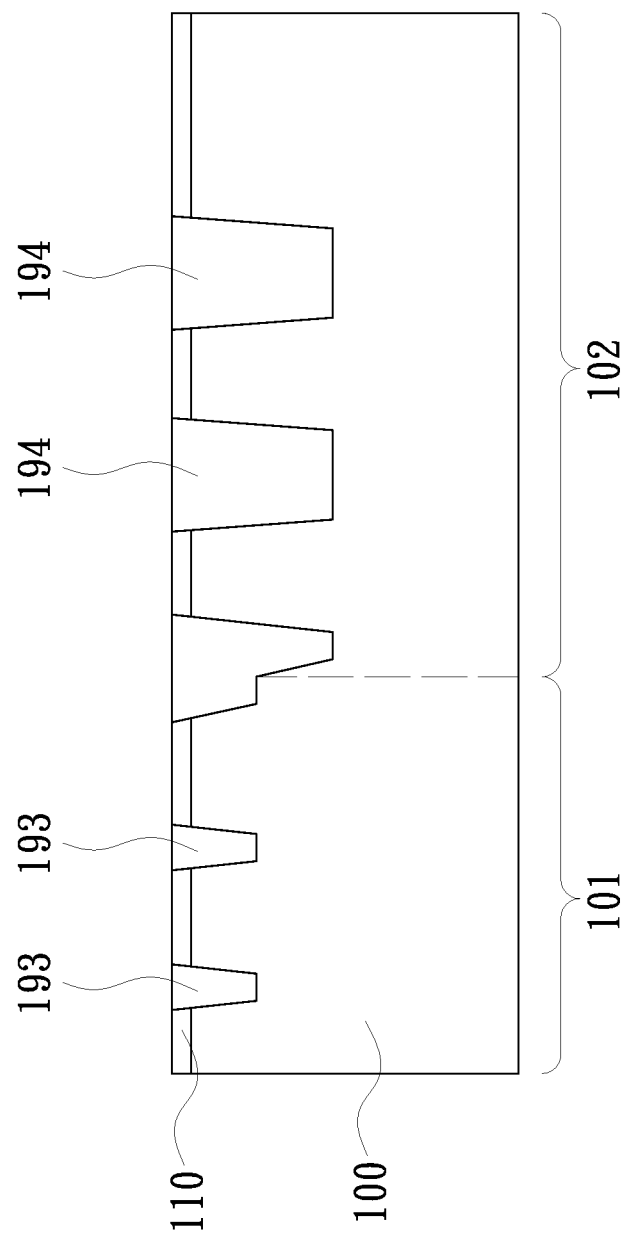

Later, a STI oxide layer 193 and a STI oxide layer 194 is deposited to fill the at least one first trench 191 and the at least one second trench 192, which is followed by a chemical-mechanical polishing (CMP) process performed until the sacrificial oxide layer 150 is removed. As shown in FIG. 1F, at least one shallower STI structure 193 is formed in the substrate 100 with respect to the first region 101 and at least one deeper STI structure 194 is formed in the substrate 100 with respect to the second region 102. Accordingly, a dual-depth STI structure is formed.

Figure 2A:
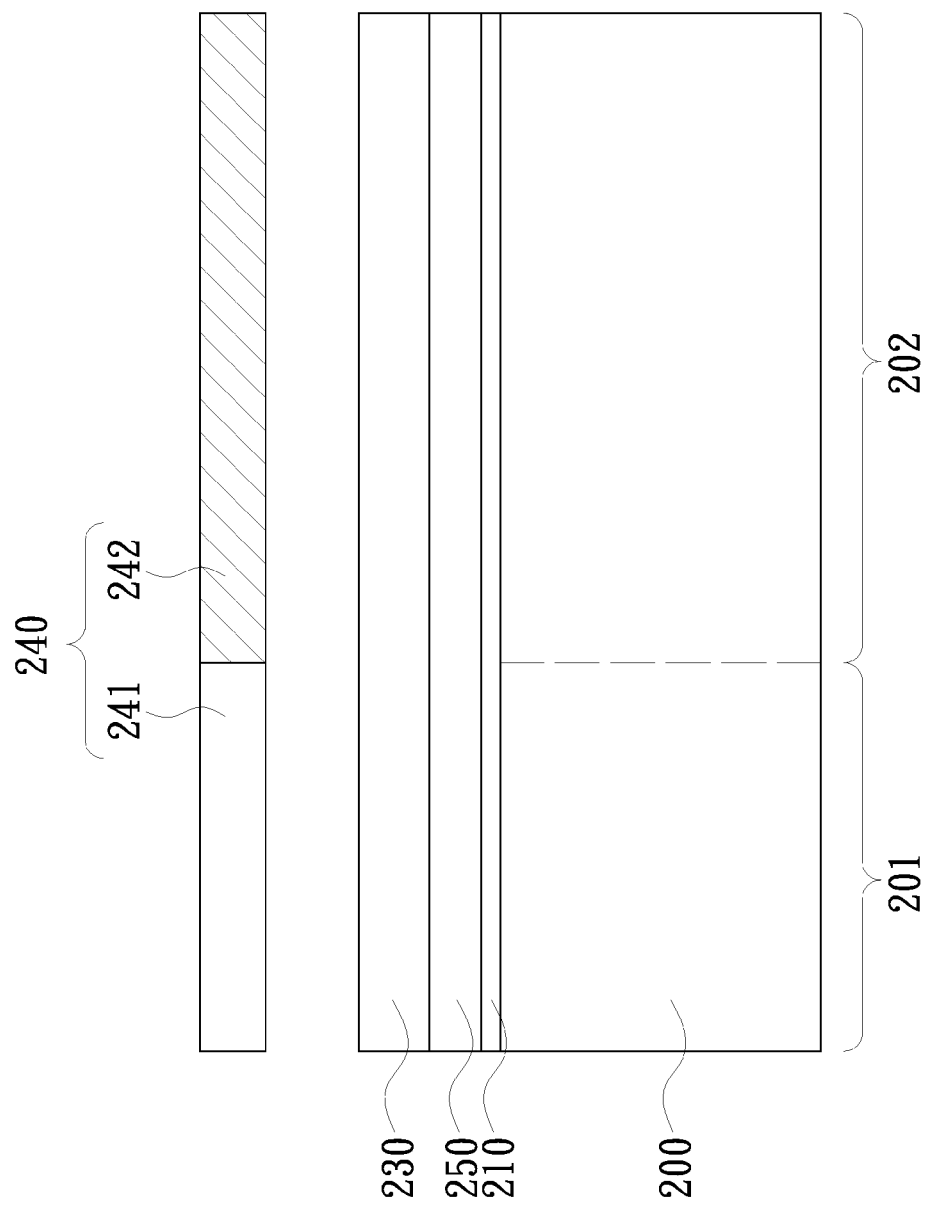
FIG. 2A to FIG. 2C are cross-sectional views showing the alternative steps for substituting the steps illustrated in FIG. 1A to FIG. 1C for manufacturing a semiconductor device with a dual-depth STI structure according to another embodiment of the present invention.
Figure 2B:
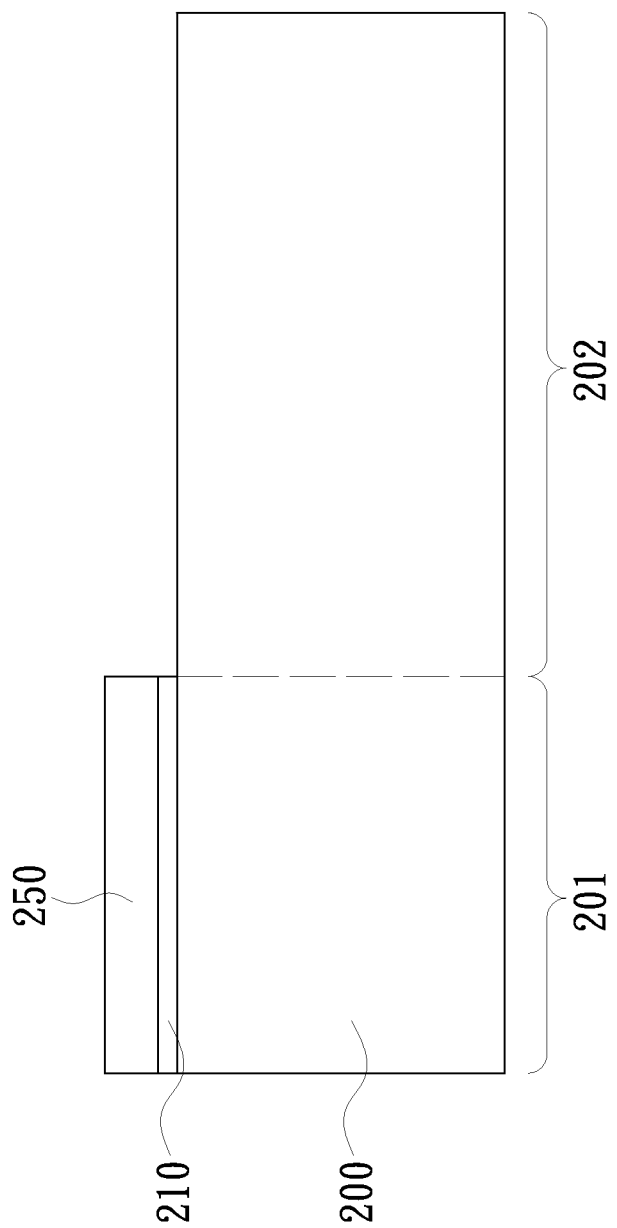
Figure 2C:
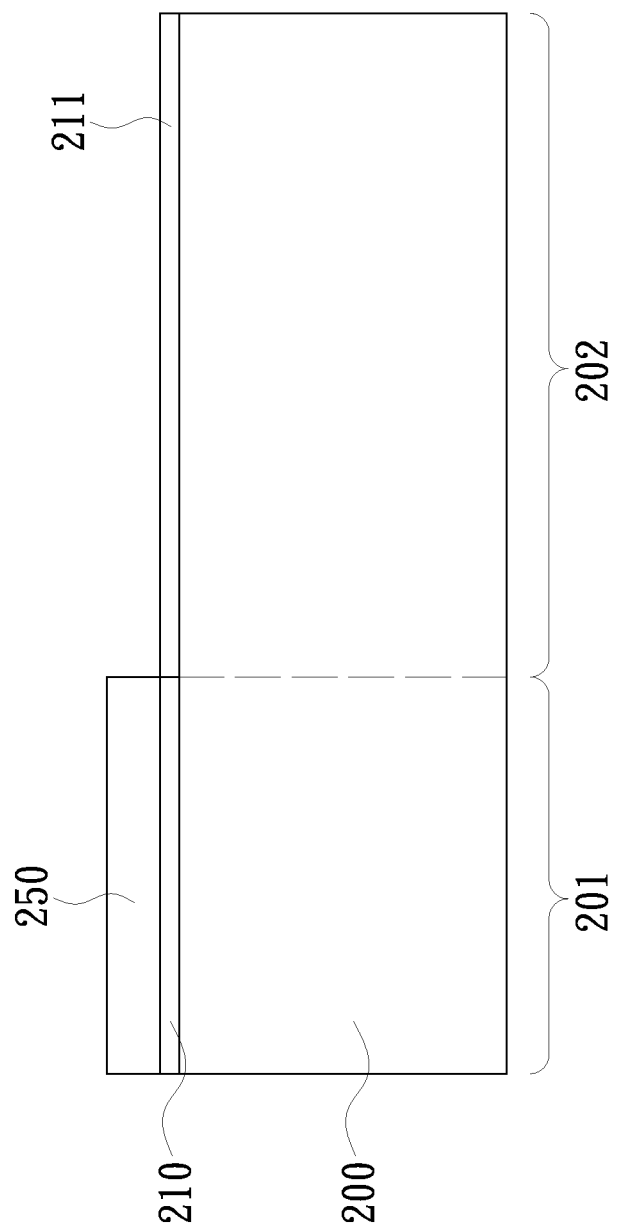

Please further refer to FIG. 2A to FIG. 2C for cross-sectional views showing the alternative steps for substituting the steps illustrated in FIG. 1A to FIG. 1C for manufacturing a semiconductor device with a dual-depth STI structure according to another embodiment of the present invention. In FIG. 2A, a Si substrate 200 is provided. The Si substrate 200 includes a first region 201 and a second region 202. A pad oxide layer 210 and an oxide layer 250 are formed in sequence on the substrate 200. The oxide layer 250 is then coated by a negative photoresist layer 230.

A patterned mask 240 is provided over the negative photoresist layer 230. The patterned mask 240 has a transparent region 241 with respect to the first region 201 and a dark region 242 with respect to the second region 202. In the present embodiment, the patterned mask 240 is one of tool layer masks, which is not intentionally designed for this process. In other words, the patterned mask 240 may also be used in defining regions such as deep n-wells (DNWs), n-wells (NWs), p-wells (PWs), etc. Accordingly, no extra cost is required for this patterned mask 240.

A pattern transfer process is carried out from the patterned mask 240 to the oxide layer 250 by lithography and etching processes so that a portion of the oxide layer 250 with respect to the second region 202 is removed and a portion of the oxide layer 250 with respect to the first region 201 remains on the pad oxide layer 210 on the substrate 200. The portion of the oxide layer 250 with respect to the first region 201 is the sacrificial oxide layer 250 on the substrate 200 with respect to the first region 201. It is noted that a portion of the pad oxide layer 210 on the substrate 200 with respect to the second region 202 may also be removed in the same etching process, as shown in FIG. 2B. It is preferable that a re-growth process is performed for forming a new pad oxide layer 211 on the substrate 200 with respect to the second region 202, as shown in FIG. 2C. It is noted that there is a step height difference between the top surface of the sacrificial oxide layer 250 and the top surface of the pad oxide layer 211.

It is noted that the resulting structure shown in FIG. 2C is similar to the resulting structure shown in FIG. 1C even though the structure in FIG. 2C is formed by different processes from the structure in FIG. 1C. Accordingly, the method according to another embodiment of the present invention may also proceed from FIG. 2C to continue on to FIG. 1D, FIG. 1E and FIG. 1F as previously presented, and thus descriptions thereof are not redundantly repeated herein.

The main feature of the present invention is that, by employing etching selectivity between a sacrificial oxide layer and the Si substrate, only a one-step etching process is required to provide a dual-depth STI structure having two different depths. With of realization of the present invention, a semiconductor device with a dual-depth STI structure is manufactured using only one trench defining mask for both the deeper STI structure and the shallower STI structure at the same time, which saves the time and the cost.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for manufacturing a semiconductor device, comprising steps of:
   providing a substrate comprising a first region and a second region;
   forming a sacrificial oxide layer on said substrate with respect to said first region;
   forming a sacrificial nitride layer conformally on said sacrificial oxide layer and on said substrate with respect to said second region;
   coating a photoresist layer over said sacrificial nitride layer;
   providing a shallow trench isolation (STI) mask having at least one first STI pattern and at least one second STI pattern;
   transferring said at least one first STI pattern and said at least one second STI pattern to said substrate to form at least one first trench in said substrate with respect to said first region and at least one second trench in said substrate with respect to said second region;
   depositing a STI oxide layer to fill said at least one first trench and said at least one second trench; and
   performing a chemical-mechanical polishing (CMP) process until said sacrificial oxide layer is removed.

2. The method of claim 1, wherein said step of transferring said at least one first STI pattern and said at least one second STI pattern to said substrate comprises steps of:
   patterning said photoresist layer over said sacrificial nitride layer by photolithography;
   patterning said sacrificial nitride layer by etching using said patterned photoresist layer as an etching mask; and
   selectively etching said sacrificial oxide layer and said substrate using said patterned sacrificial nitride layer as an etching mask to form said at least one first trench in said substrate with respect to said first region and said at least one second trench in said substrate with respect to said second region.

3. The method of claim 2, wherein a relation for selectively etching is expressed as:

$$\text{Depth } A = \text{Depth } B - X^*(\text{THK})$$

wherein Depth A denotes the depth of said at least one first trench in said substrate, Depth B denotes the depth of said at least one second trench in said substrate, THK denotes the thickness of said sacrificial oxide layer and X denotes the etching selectivity ratio.

4. The method of claim 3, wherein selective etching is performed by dry etching.

5. The method of claim 4, wherein selective etching is performed by dry etching using a mixture comprising $Cl_2$, $HeO_2$ and HBr.

6. The method of claim 5, wherein said mixture is within a range from $Cl_2$:$HeO_2$:HBr=1:0.3:7 to $Cl_2$:$HeO_2$:HBr=1:0.6:13 in weight.

7. The method of claim 6, wherein the etching selectivity ratio is within a range from $SiO_2$:Si=1:4 to $SiO_2$:Si=1:10.

8. The method of claim 5, wherein said mixture is $Cl_2$:$HeO_2$:HBr=1:0.45:10 in weight.

9. The method of claim 3, wherein selective etching is performed by wet etching.

10. The method of claim 9, wherein selective etching is performed by wet etching using a mixture comprising tetramethylammonium hydroxide (TMAH) and $H_2O$.

11. The method of claim 10, wherein said mixture is within a range from TMAH:$H_2O$=1:20 to TMAH:$H_2O$=2:5 in weight.

12. The method of claim 11, wherein the etching selectivity ratio is within a range from $SiO_2$:Si=1:40000 to $SiO_2$:Si=1:25000.

13. The method of claim 1, wherein said step of forming said sacrificial oxide layer on said substrate with respect to said first region comprises steps of:
   providing a thin nitride layer on said substrate;
   coating a positive photoresist layer over said thin nitride layer on said substrate;
   providing a patterned mask having a transparent region with respect to said first region and a dark region with respect to said second region;
   performing a pattern transfer process from said patterned mask to said thin nitride layer so that a portion of said thin nitride layer with respect to said first region is removed and a portion of said thin nitride layer with respect to said second region remains on said substrate; and
   forming said sacrificial oxide layer on said first region of said substrate and removing said portion of said thin nitride layer on said substrate with respect to said second region.

14. The method of claim 13, wherein said step of transferring said at least one first STI pattern and said at least one second STI pattern to said substrate comprises steps of:
   patterning said photoresist layer over said sacrificial nitride layer by photolithography;
   patterning said sacrificial nitride layer by etching using said patterned photoresist layer as an etching mask; and
   selectively etching said sacrificial oxide layer and said substrate using said patterned sacrificial nitride layer as an etching mask to form said at least one first trench in said substrate with respect to said first region and said at least one second trench in said substrate with respect to said second region.

15. The method of claim 14, wherein a relation for selectively etching is expressed as:

$$\text{Depth } A = \text{Depth } B - X^*(\text{THK})$$

wherein Depth A denotes the depth of said at least one first trench in said substrate, Depth B denotes the depth of said at least one second trench in said substrate, THK denotes the thickness of said sacrificial oxide layer and X denotes the etching selectivity ratio.

16. The method of claim 1, wherein said step of forming said sacrificial oxide layer on said substrate with respect to said first region comprises steps of:
   providing an oxide layer on said substrate;
   coating a negative photoresist layer over said oxide layer on said substrate;
   providing a patterned mask having a transparent region with respect to said first region and a dark region with respect to said second region; and
   performing a pattern transfer process from said patterned mask to said oxide layer so that a portion of said oxide layer with respect to said second region is removed and a portion of said oxide layer with respect to said first region remains on said substrate;

wherein said portion of said oxide layer with respect to said first region is said sacrificial oxide layer on said substrate with respect to said first region.

17. The method of claim 16, wherein said step of transferring said at least one first STI pattern and said at least one second STI pattern to said substrate comprises steps of:
patterning said photoresist layer over said sacrificial nitride layer by photolithography;
patterning said sacrificial nitride layer by etching using said patterned photoresist layer as an etching mask; and
selectively etching said sacrificial oxide layer and said substrate using said patterned sacrificial nitride layer as an etching mask to form said at least one first trench in said substrate with respect to said first region and said at least one second trench in said substrate with respect to said second region.

18. The method of claim 17, wherein a relation for selectively etching is expressed as:

Depth $A$=Depth $B$−$X$*(THK)

wherein Depth A denotes the depth of said at least one first trench in said substrate, Depth B denotes the depth of said at least one second trench in said substrate, THK denotes the thickness of said sacrificial oxide layer and X denotes the etching selectivity ratio.

\* \* \* \* \*